United States Patent [19]
Drumm

[11] Patent Number: 5,912,056
[45] Date of Patent: *Jun. 15, 1999

[54] BLACK MATRIX WITH CONDUCTIVE COATING

[75] Inventor: Paul M. Drumm, San Jose, Calif.

[73] Assignee: Candescent Technologies Corporation, San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/829,251

[22] Filed: Mar. 31, 1997

[51] Int. Cl.$^6$ ............... B05D 5/12; G03C 5/00; C08J 7/04
[52] U.S. Cl. ............ 427/510; 427/553; 427/75; 427/77; 430/312; 430/313; 430/319; 430/25
[58] Field of Search ............... 427/75, 510, 553, 427/555, 250, 77; 430/25, 26, 27, 28, 312, 313, 319

[56] References Cited

U.S. PATENT DOCUMENTS

| | | | |
|---|---|---|---|
| 2,190,020 | 2/1940 | Goldsmith et al. | 427/75 |
| 2,324,505 | 7/1943 | Iams et al. | 427/75 |
| 3,661,580 | 5/1972 | Mayaud | 430/25 |
| 3,884,694 | 5/1975 | Gallaro et al. | 429/510 |
| 3,884,695 | 5/1975 | Gallaro et al. | 430/510 |
| 3,891,440 | 6/1975 | Gallaro et al. | 430/27 |
| 4,150,990 | 4/1979 | Stetz | 427/510 |
| 4,288,513 | 9/1981 | Kilichowski et al. | 430/28 |
| 4,556,626 | 12/1985 | Speigel | 430/28 |
| 4,757,231 | 7/1988 | Kato et al. | 313/466 |
| 5,213,849 | 5/1993 | Maner | 427/510 |
| 5,281,450 | 1/1994 | Yaniv | 427/510 |
| 5,477,105 | 12/1995 | Curtin et al. | 313/422 |
| 5,670,296 | 9/1997 | Tsai | 430/312 |
| 5,708,327 | 1/1998 | O'Boyle | 313/495 |
| 5,788,550 | 8/1998 | Jones et al. | 445/24 |
| 5,818,162 | 10/1998 | Drumm | 313/466 |

OTHER PUBLICATIONS

"High Resolution Black Matrix Coating"; Acheson Colloids Company; Electrodag CB–800A, Sep. 1997 (printed, R.V. date).

*Primary Examiner*—Marianne Padgett
*Attorney, Agent, or Firm*—Wagner, Murabito & Hao

[57] ABSTRACT

A method for forming a conductively coated matrix structure for separating rows and columns of sub-pixels on the faceplate of a flat panel display device. In one embodiment, the present invention deposits a photoresistive material over the interior surface of a faceplate having a non-conductive matrix structure formed thereon. The photoresistive material is deposited into sub-pixel regions separated by the matrix structure. The photoresistive material is dried and exposed in the sub-pixel regions. After unexposed photoresistive material is removed, a layer of aluminum is evaporated over the interior surface of the faceplate such that the matrix structure and the exposed layer of photoresistive material in the sub-pixel regions is coated with a conductive layer of aluminum. Next, the present invention applies an etchant to the exposed photoresistive material disposed in the sub-pixel regions. The etchant removes the exposed photoresistive material and the overlying conductive layer of aluminum from the sub-pixel regions such that the conductive layer of aluminum remains only on the matrix structure, and does not cover the sub-pixel regions.

18 Claims, 7 Drawing Sheets

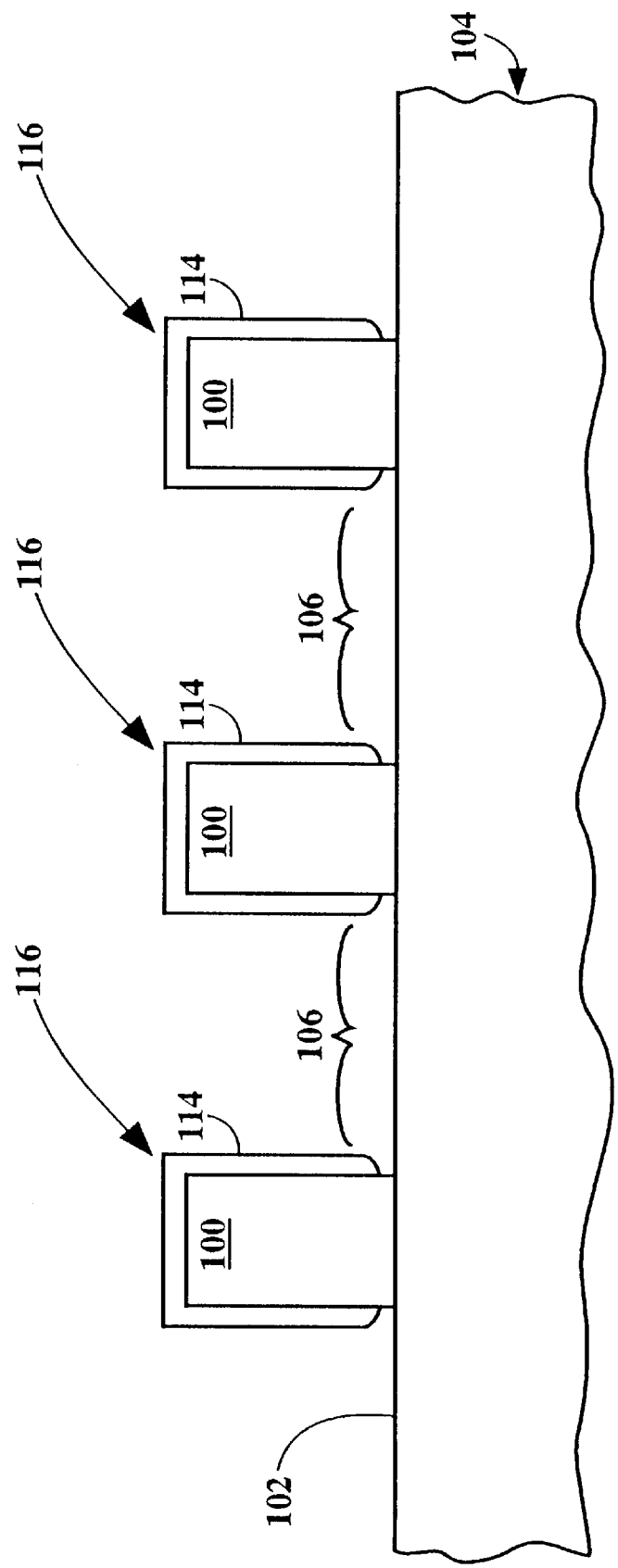

BLACK MATRIX WITH CONDUCTIVE COATING

FIELD OF THE INVENTION

The present claimed invention relates to the field of flat panel displays. More particularly, the present claimed invention relates to the black matrix of a flat panel display screen structure.

BACKGROUND ART

Sub-pixel regions on the faceplate of a flat panel display are typically separated by an opaque mesh-like structure commonly referred to as a black matrix. By separating sub-pixel regions, the black matrix prevents electrons directed at one sub-pixel from being "back-scattered" and striking another sub-pixel. In so doing, a conventional black matrix prevents helps maintain a flat panel display with sharp resolution. In addition, the black matrix is also used as a base on which to locate structures such as, for example, support walls.

In one prior art black matrix, a very thin layer (e.g. approximately 2–3 microns) of a conductive material is applied to the interior surface of the faceplate surrounding the sub-pixel regions. Typically, the conductive black matrix is formed of a conductive graphite material. By having a conductive black matrix, excess charges induced by electrons striking the top or sides of the black matrix can be easily drained from the interior surface of the faceplate. Additionally, by having a conductive black matrix, electrical arcs occurring between field emitters of the flat panel display and the faceplate will be more likely to strike the black matrix. Such arcing is of particular concern in high voltage environments. By having the electrical arcing occur between the black matrix and the field emitters instead of between the sub-pixels and the field emitters, the integrity of the phosphors and the overlying aluminum layer is maintained. Unfortunately, due to the relatively low height of such a prior art conductive black matrix, arcing can still occur from the field emitter to the sub-pixel regions. As a result of such arcing, phosphors and the overlying aluminum layer can be damaged. As mentioned above, however, the black matrix is also intended to prevent back-scattering of electrons from one sub-pixel to another sub-pixel. Thus, it is desirable to have a black matrix with a height which sufficiently isolates each sub-pixel from respective neighboring sub-pixels. However, due to the physical property of the conductive graphite material, the height of the black matrix is limited to the aforementioned 2–3 microns.

In another prior art black matrix, a non-conductive polyimide material is patterned across the interior surface of the black matrix. In such a conventional black matrix, the black matrix has a uniform height of approximately 20–40 microns. Thus, the height of such a black matrix is well suited to isolating each sub-pixel from respective neighboring sub-pixels. As a result, such a black matrix configuration effectively prevents unwanted back-scattering of electrons into neighboring sub-pixels. Unfortunately, prior art polyimide black matrices are not conductive. As a result, even though the top edge of the polyimide black matrix is much closer than the sub-pixel region is to the field emitter, unwanted arcing can still occur from the field emitter to the sub-pixel regions. In a prior art attempt to prevent such arcing, a conductive coating (i.e. indium tin oxide (ITO)) is applied to the non-conductive polyimide black matrix. ITO coated non-conductive black matrices are not without problems, however. For example, the high atomic weight of ITO results in unwanted back-scattering of electrons. Furthermore, ITO has a undesirably high secondary emission coefficient, $\delta$.

Additionally, coating non-conductive black matrices with a layer of ITO commonly results in the deposition of ITO on the faceplate in the sub-pixel regions. As a result, a layer of ITO layer underlies subsequently deposited phosphors. Due to the high index of refraction of the ITO material, light emitted from the phosphors can be reflected away from the faceplate, thereby reducing the emission intensity of the flat panel display.

Thus, a need exists for a conductively coated black matrix structure which effectively separates neighboring sub-pixels. A further need exists for a conductively coated black matrix structure which does not have the increased back-scattering rate, and the undesirably high secondary emission coefficient associated with an ITO coated black matrix structure. Still another need exists for a conductively coated black matrix structure which does not result in the formation of a highly reflective layer in the sub-pixel regions of a flat panel display.

SUMMARY OF INVENTION

The present invention provides a conductively coated black matrix structure which effectively separates neighboring sub-pixels. The present invention further provides a conductively coated black matrix structure which does not have the increased back-scattering rate, and the undesirably high secondary emission coefficient associated with an ITO coated black matrix structure. The present invention achieves the above accomplishments without the formation of a highly reflective layer in the sub-pixel regions of a flat panel display.

Specifically, in one embodiment, the present invention deposits a photoresistive material over the interior surface of a faceplate having a non-conductive matrix structure formed thereon. The photoresistive material is deposited into sub-pixel regions separated by the matrix structure. The photoresistive material is dried and exposed in the sub-pixel regions. After unexposed photoresistive material is removed, a layer of aluminum is evaporated over the interior surface of the faceplate such that the matrix structure and the exposed layer of photoresistive material in the sub-pixel regions is coated with a conductive layer of aluminum. Next, the present invention applies an etchant to the exposed photoresistive material disposed in the sub-pixel regions. The etchant removes the exposed photoresistive material and the overlying conductive layer of aluminum from the sub-pixel regions such that the conductive layer of aluminum remains only on the matrix structure, and does not cover the sub-pixel regions.

As a result, the present invention is comprised of a conductively coated matrix structure for defining sub-pixel regions in a flat panel display device. That is, a non-conductive matrix disposed on the interior surface of a faceplate separates the sub-pixel regions. The non-conductive matrix is coated with a layer of conductive material such that a conductively coated matrix structure is formed. Furthermore, in the present invention, the layer of conductive material coats only the non-conductive matrix such that the sub-pixel regions do not have a layer of conductive material disposed therein.

In another embodiment, the present invention includes the features of the above-described embodiment, and further recites that a black matrix dispersion material instead of aluminum is used to conductively coat the matrix structure.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention:

FIGS. 1A–1G are side sectional views of process steps used to form a conductively coated matrix structure in accordance with the present claimed invention.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
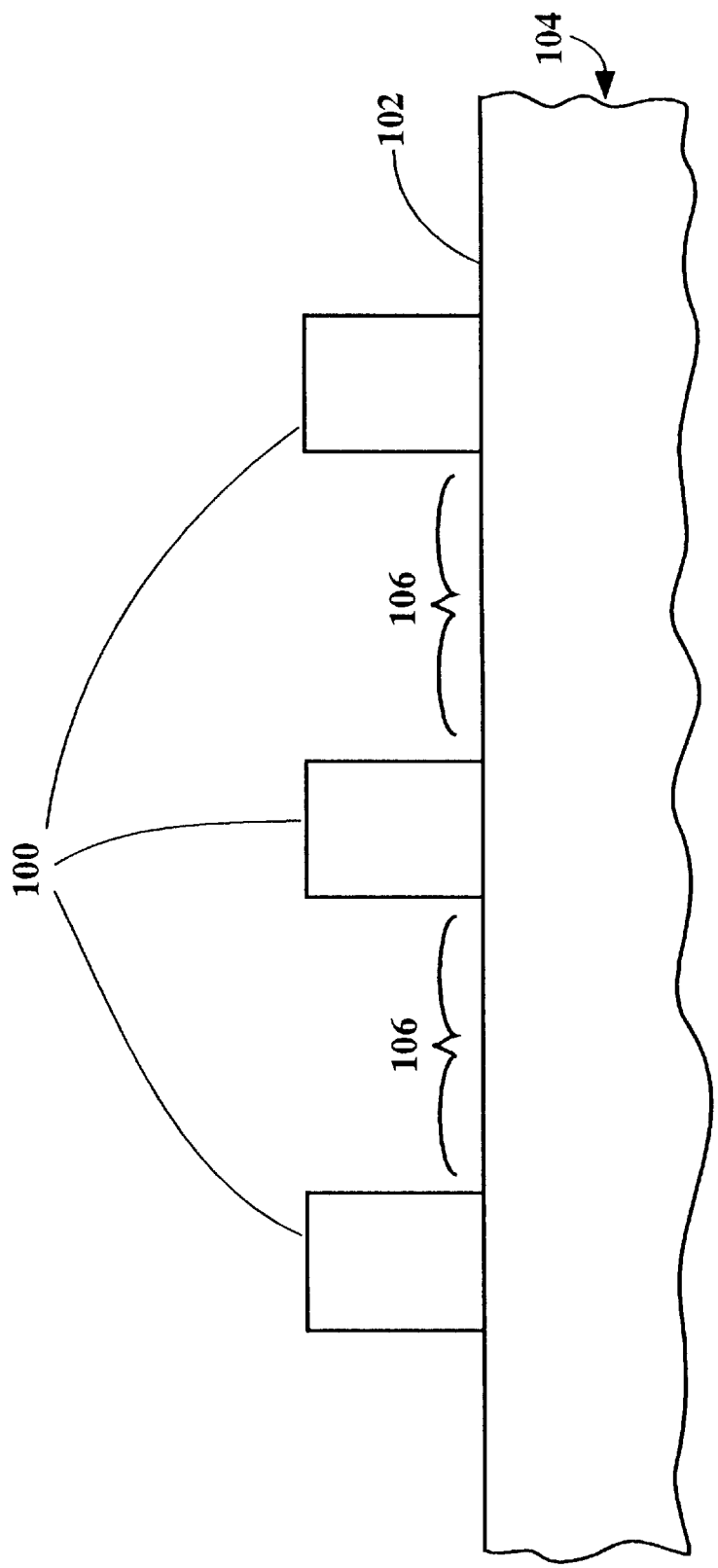

With reference to now to FIGS. 1A–1G side sectional views of process steps used to form a conductively coated matrix structure in accordance with the present claimed invention are shown. Referring specifically to FIG. 1A, a side-sectional view of a starting point in the formation of the present invention is shown. As shown in FIG. 1A, a non-conductive black matrix 100 is disposed on the interior surface 102 of a faceplate 104. Non-conductive black matrix 100 is configured to separate rows and columns of sub-pixel regions, typically shown as 106, on the interior surface 102 of faceplate 104. Although a the present invention referred to a non-conductive black matrix 100, it will be understood that the term "black" refers to the opaque characteristic of the matrix. Thus, the present invention is also well suited to having a color other than black. In the present embodiment, non-conductive black matrix structure 100 (hereinafter non-conductive matrix structure) is formed, for example, of polyimide using techniques well known in the art. Additionally, in the present embodiment, non-conductive matrix structure 100 has a height of approximately 20–40 microns. Although specific materials and dimensions are recited in the present embodiment, the present invention is also well suited to using various other materials to form a non-conductive matrix structure 100 having various other dimensions.

Figure 1B:
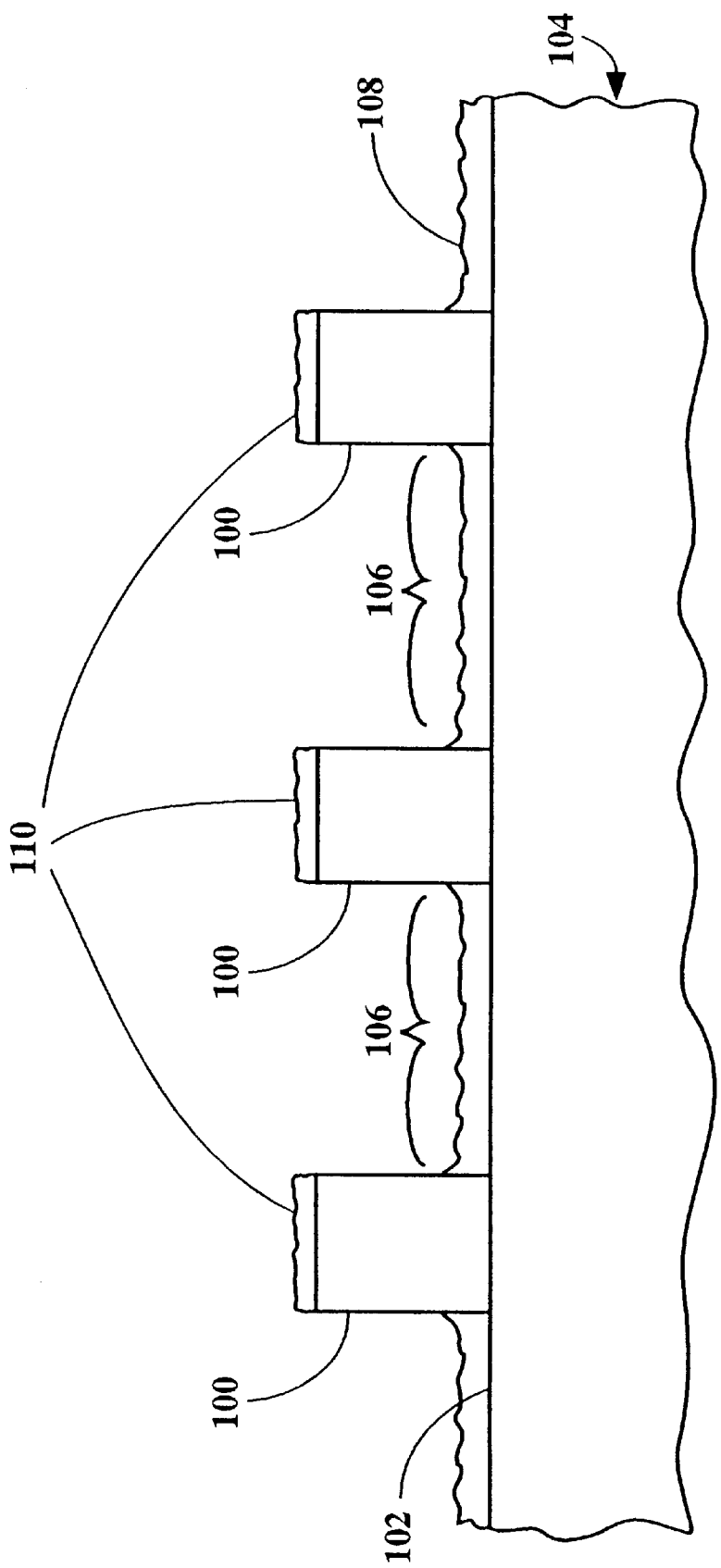

With reference next to FIG. 1B, in the present invention, a photoresistive material 108 is deposited over interior surface 102 of faceplate 104 and non-conductive matrix structure 100. As shown in FIG. 1B, photoresistive material 108 is deposited onto the top of non-conductive matrix structure 100, forming portions 110 of photoresistive material 108 thereon. Furthermore, photoresistive material 108 also settles into sub-pixel regions 106. In the present embodiment, photoresistive material 108 is comprised of a mixture of poly vinyl alcohol (PVA) and a metal dichromate such as, for example, ammonium dichromate.

Figure 1C:
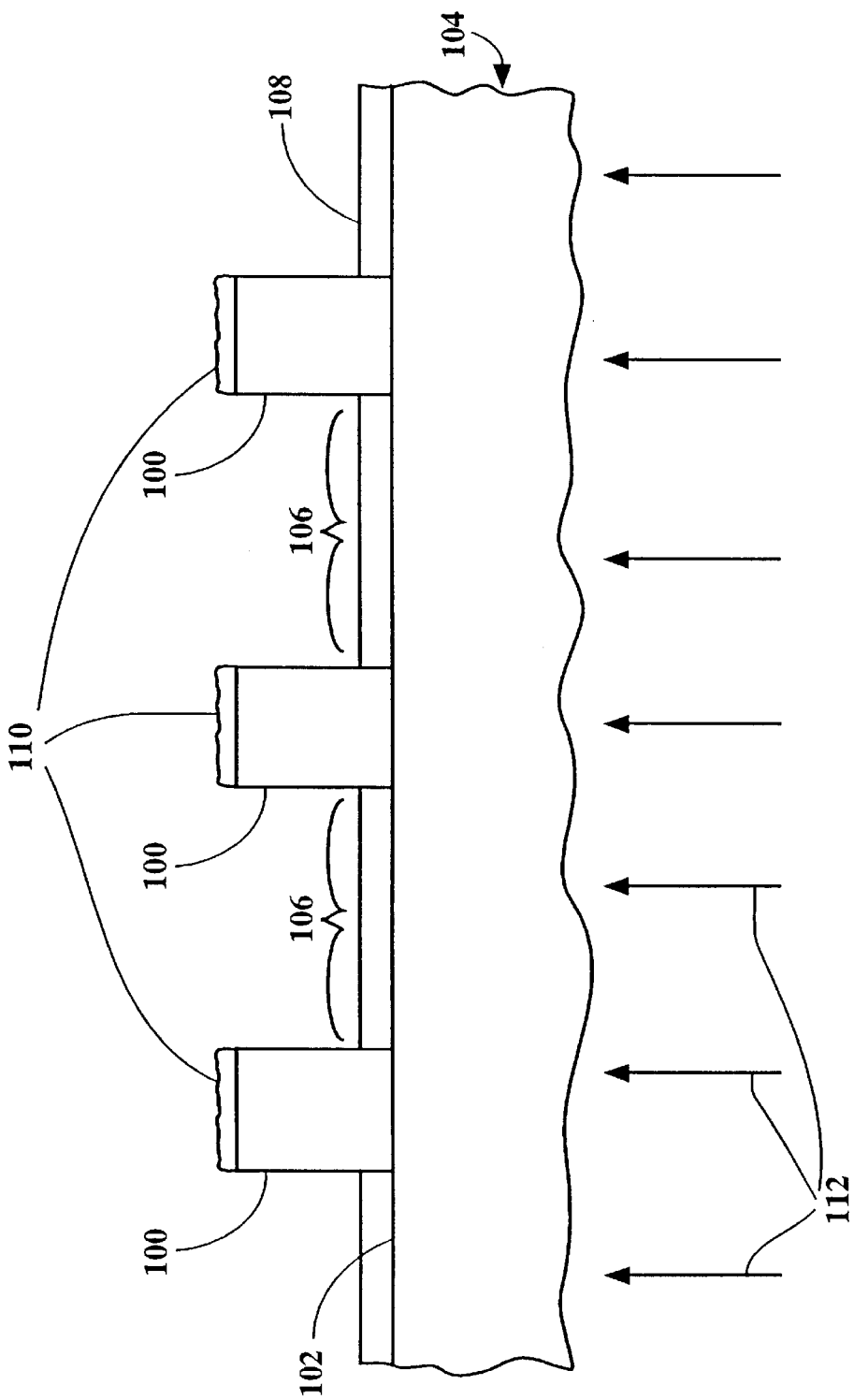

Referring now to FIG. 1C, photoresistive material 108 is then dried. In so doing, a dried layer of photoresistive material 108 is formed in sub-pixel regions 106 on interior surface 102 of faceplate 104, and on the top surface of non-conductive matrix 100. The dried layer of photoresistive material 108 is then exposed to light, typically represented by rays 112, from the exterior surface of faceplate 104 such that an exposed layer of photoresistive material 108 cures and adheres to interior surface 102 of the faceplate 104. In the present embodiment, light 112 is comprised of ultra-violet (UV) light emanating from a light source, not shown, which is disposed on the exterior surface of faceplate 104. In the present invention, by exposing photoresistive material 108 to light 112 from the exterior surface of faceplate 104, non-conductive matrix structure 100 masks portions 110 of photoresistive material 108 from light 112. As a result, portions 110 of photoresistive material 108 are prevented from being exposed. Thus, only the photoresistive material 108 disposed in sub-pixel regions 106 is cured.

Figure 1D:
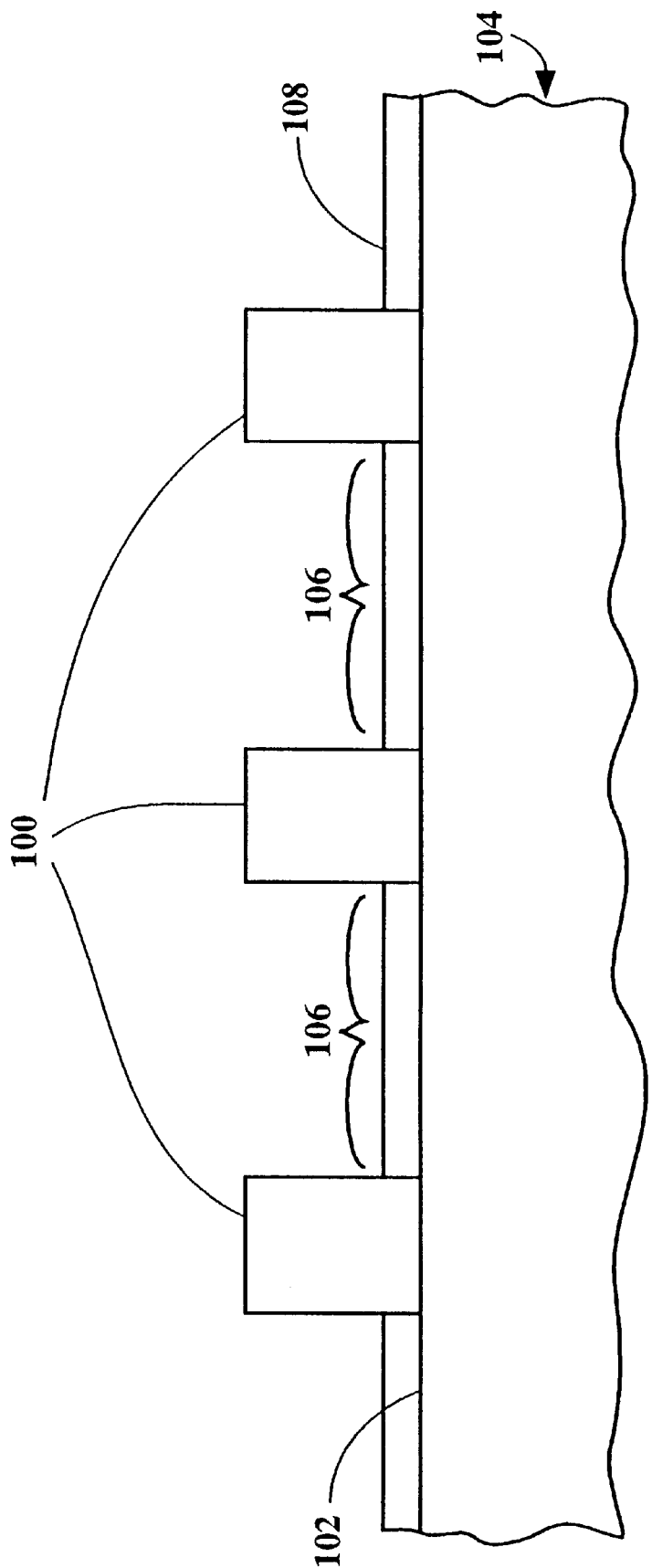

With reference now to FIG. 1D, the present invention then removes the photoresistive material 108 which was not exposed by light 112 of FIG. 1C. That is, photoresistive material 108 residing other than in sub-pixel regions 106 is removed. Thus, portions 110 of FIGS. 1B and 1C are removed. In the present embodiment, the unexposed photoresistive material 108 is removed by rinsing non-conductive matrix structure 100 and interior surface 102 of faceplate 104 with water. Although water is used to remove the unexposed photoresistive material in the present embodiment, the present invention is also well suited to using various other methods to remove the unexposed photoresistive material.

Figure 1E:
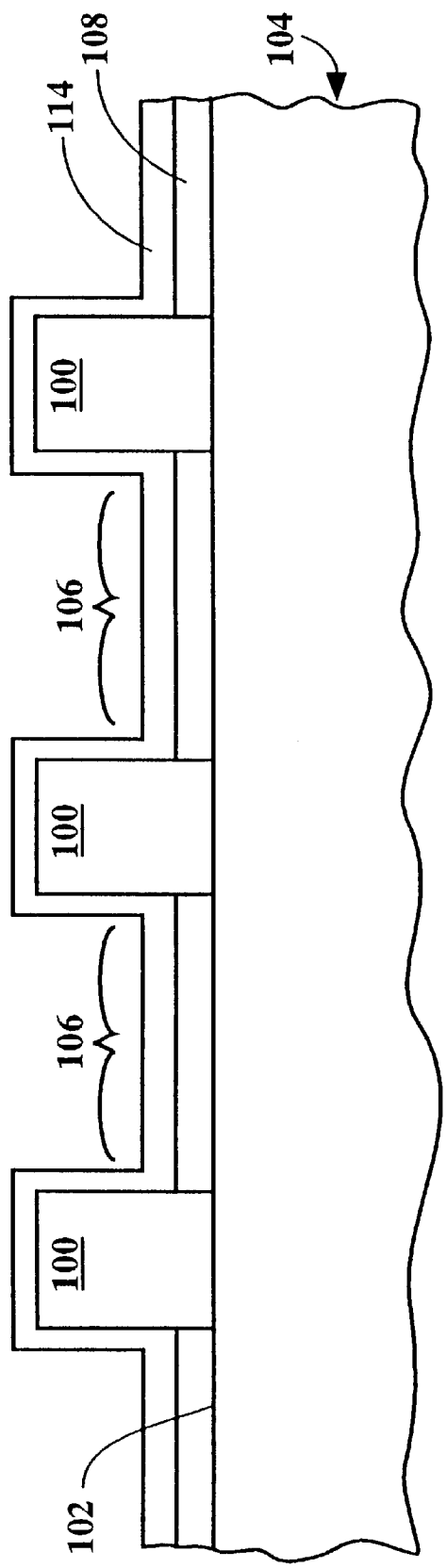

Referring now to FIG. 1E, after the removal of the unexposed photoresistive material, a layer of conductive material 114 is evaporated over interior surface 102 of faceplate 104. Conductive material 114 is evaporated such that non-conductive matrix structure 100 and the exposed layer of photoresistive material 108 present in sub-pixel regions 106 is coated with layer of conductive material 114. In the present embodiment, conductive material is comprised of aluminum. However, the present invention is also well suited to applying other conductive material such as, for example a black matrix dispersion substance such as, CB800A Electrodag made by Acheson Colloids of Port Huron, Mich., over interior surface 102 of faceplate 104. As shown in FIG. 1E, non-conductive matrix structure 100 is now coated with a layer of conductive material 114.

Figure 1F:
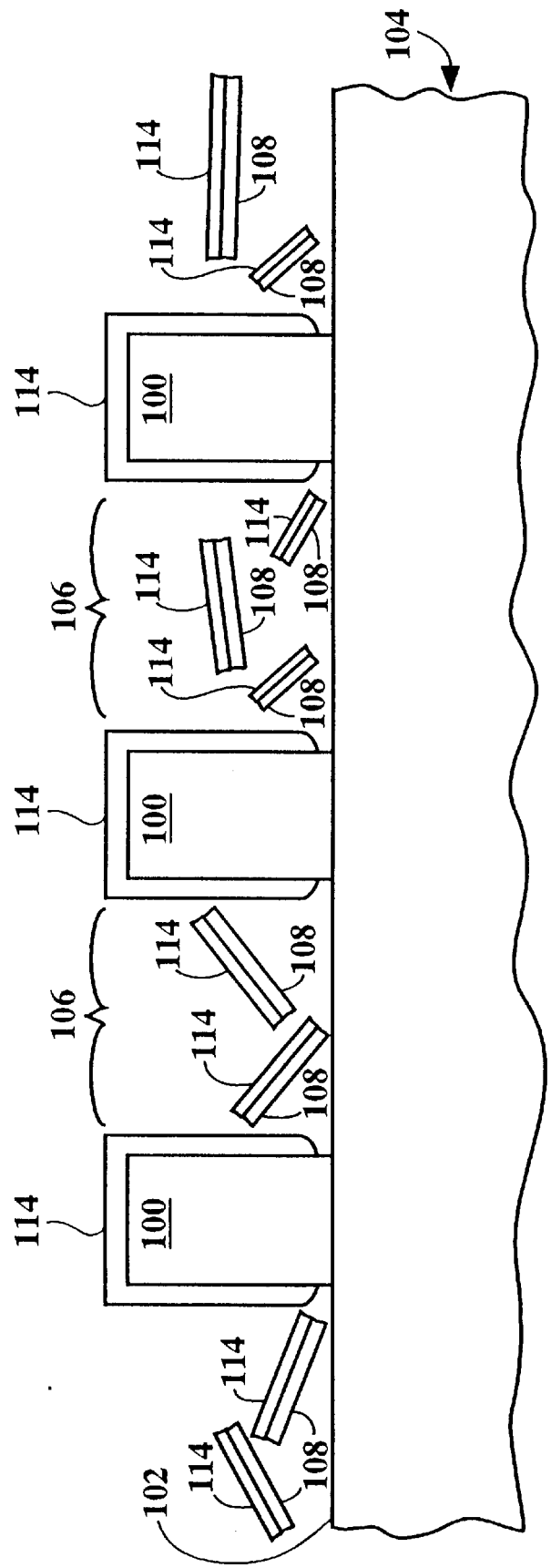

With reference next to FIG. 1F, the present invention then applies an etchant to interior surface 102 of faceplate 104. The etchant selectively attacks the exposed photoresistive material 108. As mentioned above, the exposed photoresistive material 108 now remains disposed almost exclusively in sub-pixel regions 106. The etchant removes the exposed photoresistive material 108 and, consequently, the conductive material 114 overlying the exposed photoresistive material 108. That is, as shown in FIG. 1E, the exposed photoresistive material 108 is removed from interior surface 102 of faceplate 104, and the overlying conductive material 114 deposited on the exposed photoresistive material 108 is also removed. As a result, photoresistive material 108 and overlying conductive material 114 is also removed from interior surface 102 of faceplate 104. Thus, sub-pixel regions 106 have no material disposed therein, and conductive material 114 remains only coating non-conductive matrix structure 100. In the present embodiment, the etchant is comprised of hydrogen peroxide. However, the present invention is also well suited to the use of various other poly vinyl alcohol (PVA) and metal dichromate selective etchants such as, for example, a hydrogen peroxide/ammonium hydroxide solution.

With reference now to FIG. 1G, after the etching step of FIG. 1F, a conductively coated matrix structure 116 is achieved. Specifically, non-conductive matrix structure 100 is now coated with a layer of conductive material 114. Moreover, sub-pixel regions 106 are not deleteriously coated with any type of material. As a result, light emitted from the phosphors subsequently deposited into sub-pixel regions 106 will not be reflected away from the faceplate. Thus, the present invention achieves an increase in emission intensity over conventional flat panel displays. Furthermore, by coating non-conductive matrix structure 100 with a material other than ITO, the conductively coated matrix structure 116 of the present invention does not suffer from the increased back-scattering rate, and undesirably high secondary emission coefficient associated with conventional ITO coated black matrix structures. As yet another advantage, the substantial height (20–40 microns) of the present conductively coated matrix structure 116 effectively isolates neighboring sub-pixels and prevents unwanted back-scattering. The substantial height and conductivity of the present conductively coated matrix structure 116 prevent arcing from the field emitters to the faceplate. By preventing arcing from the field emitters to the faceplate, the present invention increases the high voltage robustness of the flat panel display in which conductively coated matrix structure 116 is employed. Furthermore, the conductive nature of the present invention 116 allows excess charge to be readily removed from the faceplate of the flat panel display.

Thus, the present invention provides a conductively coated black matrix structure which effectively separates neighboring sub-pixels. The present invention further provides a conductively coated black matrix structure which does not have the increased back-scattering rate, and the undesirably high secondary emission coefficient associated with an ITO coated black matrix structure. The present invention achieves the above accomplishments without the formation of a highly reflective layer in the sub-pixel regions of a flat panel display.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

I claim:

1. A method for forming a conductively coated matrix structure for separating rows and columns of sub-pixels on a faceplate of a flat panel display device, said method comprising steps of:
   a) depositing a photoresistive material over an interior surface of said faceplate having a non-conductive matrix structure formed thereon, said photoresistive material deposited into sub-pixel regions separated by said non-conductive matrix structure;
   b) drying said photoresistive material such that a dried layer of said photoresistive material is formed in said sub-pixel regions on said interior surface of said faceplate;
   c) exposing said photoresistive material to light from an exterior surface of said faceplate such that an exposed layer of said photoresistive material cures and adheres to said interior surface of said faceplate;
   d) removing said photoresistive material which was not exposed by said light;
   e) evaporating aluminum over said interior surface of said faceplate such that said non-conductive matrix structure and said exposed layer of said photoresistive material present in said sub-pixel regions is coated with a conductive layer of said aluminum, such that said conductive layer disposed on said non-conductive matrix reduces arcing between electron emitters and said sub-pixel regions by disposing said conductive layer more closely to said electron emitters than are said sub-pixel regions in said flat panel display device; and
   f) applying an etchant to said exposed photoresistive material disposed in said sub-pixel regions to remove said exposed photoresistive material and said overlying conductive layer of aluminum from said sub-pixel regions such that said conductive layer of aluminum remains only on said non-conductive matrix structure.

2. The method for forming a conductively coated matrix structure as recited in claim 1, wherein said step a) comprises:
   depositing said photoresistive material comprised of poly vinyl alcohol (PVA) and a metal dichromate over the interior surface of said faceplate, said non-conductive matrix structure formed thereon, and into said sub-pixel regions separated by said non-conductive matrix structure.

3. The method for forming a conductively coated matrix structure as recited in claim 1, wherein said step a) comprises:
   depositing said photoresistive material comprised of said poly vinyl alcohol (PVA) and ammonium dichromate over the interior surface of said faceplate, said non-conductive matrix structure formed thereon, and into said sub-pixel regions separated by said non-conductive matrix structure.

4. The method for forming a conductively coated matrix structure as recited in claim 1, wherein said step a) comprises:
   depositing said photoresistive material comprised of poly vinyl alcohol (PVA) and a metal dichromate over said non-conductive matrix structure having a height of approximately 20–40 microns.

5. The method for forming a conductively coated matrix structure as recited in claim 1, wherein said light is ultraviolet light.

6. The method for forming a conductively coated matrix structure as recited in claim 1, wherein said step c) comprises:
   exposing said photoresistive material to said light from said exterior surface of said faceplate such that said non-conductive matrix structure masks said photoresistive material disposed on top of said non-conductive matrix structure from said light and prevents said photoresistive material disposed on top of said non-conductive matrix structure from being exposed.

7. The method for forming a conductively coated matrix structure as recited in claim 1, wherein said step d) comprises:
   removing said unexposed photoresistive material by rinsing said photoresistive material from said interior surface of said faceplate with water.

8. The method for forming a conductively coated matrix structure as recited in claim 1, wherein said step f) comprises:

applying hydrogen peroxide to said exposed photoresistive material disposed in said sub-pixel regions to remove said exposed photoresistive material and said overlying conductive layer of aluminum from said sub-pixel regions such that said conductive layer of aluminum remains only on said non-conductive matrix structure.

9. The method for forming a conductively coated matrix structure as recited in claim 1, wherein said step f) comprises:

applying a hydrogen peroxide and ammonium hydroxide solution to said exposed photoresistive material disposed in said sub-pixel regions to remove said exposed photoresistive material and said overlying conductive layer of aluminum from said sub-pixel regions such that said conductive layer of aluminum remains only on said non-conductive matrix structure.

10. A method for forming a conductively coated matrix structure for separating rows and columns of sub-pixels on the faceplate of a flat panel display device, said method comprising steps of:

a) depositing a photoresistive material over the interior surface of a faceplate having a non-conductive matrix structure formed thereon, said photoresistive material deposited into sub-pixel regions separated by said non-conductive matrix structure;

b) drying said photoresistive material such that a dried layer of said photoresistive material is formed in said sub-pixel regions on said interior surface of said faceplate;

c) exposing said photoresistive material to light from the exterior surface of said faceplate such that an exposed layer of said photoresistive material cures and adheres to said interior surface of said faceplate;

d) removing said photoresistive material which was not exposed by said light;

e) evaporating a black matrix dispersion material over said interior surface of said faceplate such that said non-conductive matrix structure and said exposed layer of said photoresistive material present in said sub-pixel regions is coated with a conductive layer of said black matrix dispersion material, such that said conductive layer of said black matrix dispersion material disposed on said non-conductive matrix reduces arcing between electron emitters and said sub-pixel regions by disposing said conductive layer of said black matrix dispersion material more closely to said electron emitters than are said sub-pixel regions in said plate panel display device; and f) applying an etchant to said exposed photoresistive material disposed in said sub-pixel regions to remove said exposed photoresistive material and said overlying conductive layer of said black matrix dispersion material from said sub-pixel regions such that said conductive layer of said black matrix dispersion material remains only on said non-conductive matrix structure.

11. The method for forming a conductively coated matrix structure as recited in claim 10, wherein said step a) comprises:

depositing said photoresistive material comprised of poly vinyl alcohol (PVA) and a metal dichromate over the interior surface of said faceplate, said non-conductive matrix structure formed thereon, and into said sub-pixel regions separated by said non-conductive matrix structure.

12. The method for forming a conductively coated matrix structure as recited in claim 10, wherein said step a) comprises:

depositing said photoresistive material comprised of poly vinyl alcohol (PVA) and ammonium dichromate over the interior surface of said faceplate, said non-conductive matrix structure formed thereon, and into said sub-pixel regions separated by said non-conductive matrix structure.

13. The method for forming a conductively coated matrix structure as recited in claim 10, wherein said step a) comprises:

depositing said photoresistive material comprised of poly vinyl alcohol (PVA) and a metal dichromate over said non-conductive matrix structure having a height of approximately 20–40 microns.

14. The method for forming a conductively coated matrix structure as recited in claim 10, wherein said light is ultra-violet light.

15. The method for forming a conductively coated matrix structure as recited in claim 10, wherein said step c) comprises:

exposing said photoresistive material to said light from said exterior surface of said faceplate such that said non-conductive matrix structure masks said photoresistive material disposed on top of said non-conductive matrix structure from said light and prevents said photoresistive material disposed on top of said non-conductive matrix structure from being exposed.

16. The method for forming a conductively coated matrix structure as recited in claim 10, wherein said step d) comprises:

removing said unexposed photoresistive material by rinsing said photoresistive material from said interior surface of said faceplate with water.

17. The method for forming a conductively coated matrix structure as recited in claim 10, wherein said step f) comprises:

applying hydrogen peroxide to said exposed photoresistive material disposed in said sub-pixel regions to remove said exposed photoresistive material and said overlying conductive layer of said black matrix dispersion material from said sub-pixel regions such that said conductive layer of said black matrix dispersion material remains only on said non-conductive matrix structure.

18. The method for forming a conductively coated matrix structure as recited in claim 10, wherein said step f) comprises:

applying a hydrogen peroxide and ammonium hydroxide solution to said exposed photoresistive material disposed in said sub-pixel regions to remove said exposed photoresistive material and said overlying conductive layer of said black matrix dispersion material from said sub-pixel regions such that said conductive layer of said black matrix dispersion material remains only on said non-conductive matrix structure.

* * * * *